United States Patent

Becker et al.

[11] Patent Number: 5,994,237
[45] Date of Patent: Nov. 30, 1999

[54] SEMICONDUCTOR PROCESSING METHODS OF FORMING A CONTACT OPENING TO A SEMICONDUCTOR SUBSTRATE

[75] Inventors: David S. Becker; Mark E. Jost, both of Boise, Id.

[73] Assignee: Micron Technology, Inc., Boise, Id.

[21] Appl. No.: 09/227,391

[22] Filed: Jan. 8, 1999

Related U.S. Application Data

[63] Continuation of application No. 08/818,629, Mar. 14, 1997, Pat. No. 5,869,403.

[51] Int. Cl.$^6$ .................................................. H01L 21/00
[52] U.S. Cl. ......................... 438/734; 438/739; 438/743; 438/756
[58] Field of Search .................................. 216/67, 79, 80, 216/99, 109; 438/723, 734, 738, 739, 740, 743, 745, 756

[56] References Cited

U.S. PATENT DOCUMENTS

| | | | |
|---|---|---|---|
| 5,229,326 | 7/1993 | Dennison et al. | 437/195 |
| 5,275,972 | 1/1994 | Ogawa et al. | 438/740 X |
| 5,286,344 | 2/1994 | Blalock et al. | 156/657 |
| 5,423,945 | 6/1995 | Marks et al. | 156/662.1 |
| 5,700,349 | 12/1997 | Tsukamoto et al. | 156/657.1 |
| 5,877,081 | 3/1999 | Matsumoto et al. | 438/740 X |

OTHER PUBLICATIONS

Singer, Peter, "Wafer Cleaning: Making the Transition to Surface Engineering", *Semiconductor International*, pp. 88–92 (Oct. 1995).

"New Clean Challenges RCA Clean's Domination", *Semiconductor International*, pp. 12–13 (Sep. 1995).

*Primary Examiner*—William Powell
*Attorney, Agent, or Firm*—Wells, St. John, Roberts, Gregory & Matkin P.S.

[57] ABSTRACT

A semiconductor processing method of forming a contact opening to a substrate includes forming at least one conductive line over the substrate adjacent a substrate contact area to which electrical connection is to be made. A first oxide layer is formed over the substrate to cover at least part of the contact area. A second oxide layer is formed over the first oxide layer and is formed from a different oxide than the first oxide layer. A first etch is conducted over the contact area and through the second oxide layer to a degree sufficient to leave at least a portion of the first oxide layer over the contact area. A second etch is conducted to a degree sufficient to remove substantially all of the first oxide layer left behind and to remove a desired amount of the second oxide layer laterally outwardly of the contact area. According to one preferred aspect of the invention, the first oxide layer is formed from decomposition of tetraethyloxysilane (TEOS) and the second oxide layer comprises borophosphosilicate glass (BPSG). According to another preferred aspect of the invention, the second etch is an isotropic etch using an aqueous solution comprising fluorine having less than or equal to about 10% by weight of an etch rate changing surfactant which etches the second oxide layer at a slower rate than the first oxide layer.

12 Claims, 3 Drawing Sheets

SEMICONDUCTOR PROCESSING METHODS OF FORMING A CONTACT OPENING TO A SEMICONDUCTOR SUBSTRATE

RELATED PATENT DATA

This patent resulted from a continuation application of U.S. patent application Ser. No. 08/818,629, filed Mar. 14, 1997, entitled "Semiconductor Processing Methods of Forming a Contact Opening to a Semiconductor Substrate", naming David S. Becker and Mark E. Jost as inventors, and which is now U.S. Pat. No. 5,869,403 the disclosure of which is incorporated by reference.

TECHNICAL FIELD

This invention relates to semiconductor processing methods of forming a contact opening to a substrate, for example a semiconductor substrate.

BACKGROUND OF THE INVENTION

Reference is made to a copending application filed on the same date as this application listing as inventors Zhiqiang Wu, Li Li, Thomas Figura, Kunal Parekh, Pai Pan, Alan Reinberg, and Manny Ma, and entitled "Ion Implanted Structures And Methods of Formation".

During fabrication of integrated circuitry, it is often desirable to form contact openings over a substrate. Often times, many layers of material overlie the substrate so that forming a desired contact opening necessarily involves etching through different overlying layers of material As an example, and referring to FIGS. 1–3, a semiconductor wafer fragment is shown generally at 10. Fragment 10 includes a top surface 12 atop which two laterally spaced apart conductive lines 14 are formed. Lines 14 comprise respective polysilicon layers 16, silicide layers 18, and insulative nitride caps 20, all of which having been formed by a previous anisotropic etch. Lines 14 also include insulative sidewall spacers 22. A thin oxide layer 24 is formed over the substrate and conductive lines 14, and typically comprises an oxide formed from decomposition of tetraethyloxysilane (TEOS). A layer 26 of borophosphosilicate glass (BPSG) is formed over layer 24 as shown.

Referring to FIG. 2, one prior art problem associated with forming a contact opening to wafer or substrate 10 is illustrated. Typically, a contact opening 28 is anisotropically etched between conductive lines 14 to a degree sufficient to expose an area 30 of the substrate between the conductive lines and to which electrical connection is to be made.

Typical etch chemistries for etching contact opening 28 etch BPSG layer 26 at a much faster rate than TEOS layer 24. Accordingly, when the anisotropic etch reaches TEOS layer 24 between contact lines 14 (FIG. 1), such must be conducted for a longer period of time to ensure that TEOS layer 24 is completely removed to adequately expose area 30. Such etch, due in part to the differing etch rates between TEOS layer 24 and BPSG layer 26, can overetch the inner-most side wall spacers 22 and erode nitride cap 20 thereby undesirably exposing silicide 18 as shown for the right-most conductive line 14 in FIG. 2. Such condition can and does cause shorting between adjacent lines or devices thereby rendering such devices useless.

Referring to FIG. 3, a prior art solution to the above-described problem is shown in which contact opening 28 is made to be narrower between conductive lines 14. As shown, the sides of contact opening 28 coincide with inner-most side wall spacers 22 so that the risk of overetching the side wall spacers and hence nitride caps 20 and silicide 18 is reduced. However, such trade offs in contact opening width and the reduced risk of overetch place sever constraints on the photomask alignment processes used to define contact opening 28.

This invention arose out of the need to provide a wider contact opening without the risk of undesirably etching the semiconductor substrate and certain semiconductor device components. In the context of this document, "contact opening" is intended to include any opening in a layer, including but not limited to openings formed within insulating or other layers and within which capacitors are formed. In the context of this document, the term "semiconductor substrate" is defined to mean any construction comprising semiconductive material, including, but not limited to, bulk semiconductive materials such as a semiconductive wafer (either alone or in assemblies comprising other materials thereon) and semiconductive material layers (either alone or in assemblies comprising other materials). The term "substrate" refers to any supporting structure including, but not limited to, the semiconductive substrates described above.

SUMMARY OF THE INVENTION

A semiconductor processing method of forming a contact opening to a substrate includes forming at least one conductive line over the substrate adjacent a substrate contact area to which electrical connection is to be made. A first oxide layer is formed over the substrate to cover at least part of the contact area. A second oxide layer is formed over the first oxide layer and is formed from a different oxide than the first oxide layer. A first etch is conducted over the contact area and through the second oxide layer to a degree sufficient to leave at least a portion of the first oxide layer over the contact area. A second etch is conducted to a degree sufficient to remove substantially all of the first oxide layer left behind and to remove a desired amount of the second oxide layer laterally outwardly of the contact area. According to one preferred aspect of the invention, the first oxide layer is formed from decomposition of tetraethyloxysilane (TEOS) and the second oxide layer comprises borophosphosilicate glass (BPSG). According to another preferred aspect of the invention, the second etch is an isotropic etch using an aqueous solution comprising fluorine and having less than or equal to about 10% by weight of an etch rate changing surfactant which etches the second oxide layer at a slower rate is than the first oxide layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and usefull arts" (Article 1, Section 8).

Figure 4:
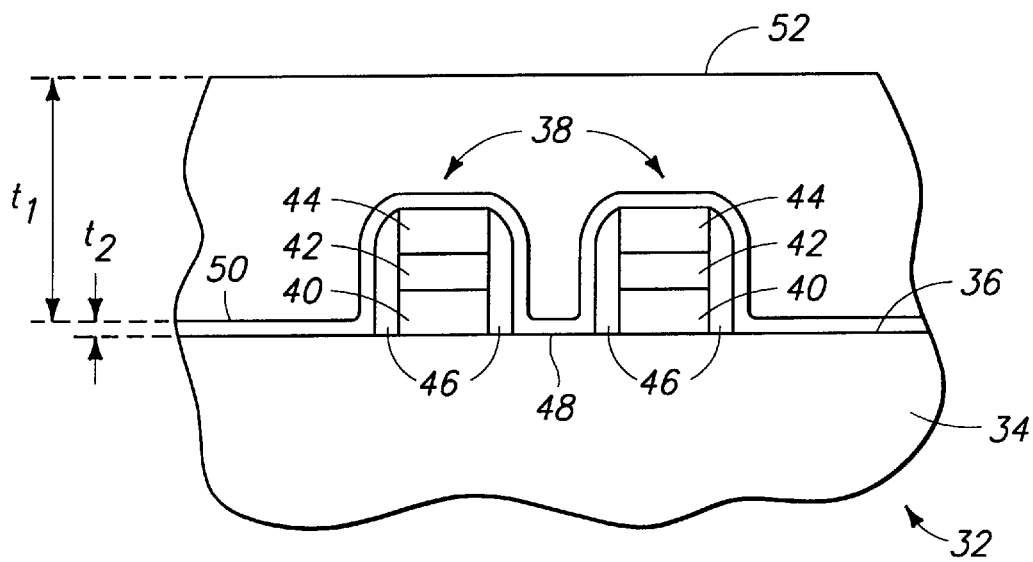
FIG. 4 is a diagrammatic sectional view of a semiconductor wafer fragment at one processing step in accordance with the invention.

Referring initially to FIG. 4, a semiconductor wafer fragment is indicated generally by reference numeral 32. Fragment 32 includes a substrate 34 having a top surface 36. A pair of conductive lines 38 are formed atop surface 36 and over substrate 34 by patterning and etching respective layers of polysilicon 40, silicide 42 and nitride 44. As so etched, nitride layers 44 form protective caps over the conductive lines. Sidewall spacers 46, preferably formed from nitride, are formed over conductive lines 38 and together with nitride caps 44 form a protective encapsulating layer. Conductive lines 38 constitute a pair of nitride insulated conductive lines between which electrical connection to substrate 34 is to be made. Preferably, lines 38 are formed adjacent a substrate contact area 48 with which the electrical connection will be made as described below.

A first oxide layer 50 is formed over substrate 34 and between conductive lines 38 covering at least part and preferably all of contact area 48. In the illustrated and preferred example, layer 50 is an undoped oxide layer which is formed or deposited by decomposition of tetraethyloxysilane (TEOS) to a thickness of from about 300–500 Angstroms. A second oxide layer 52 is formed over first oxide layer 50 and is preferably formed from a different oxide material than layer 50. In the illustrated and preferred example, second oxide layer 52 comprises a doped oxide layer of borophosphosilicate glass (BPSG) which is formed or deposited over first layer 50 to a thickness of about 10,000–14,000 Angstroms. As so formed, first oxide layer 50 is interposed between the substrate and second oxide layer 52, and preferably directly beneath the second oxide layer. For purposes of the ongoing discussion, layers 50, 52 collectively defme two different oxide layers comprising an upper oxide layer 52 having a first elevational thickness dimension $t_1$, and a lower oxide layer 50 beneath upper oxide layer 52 and having a second elevational thickness dimension $t_2$ which is less than the first elevational thickness dimension $t_1$.

Figure 1:
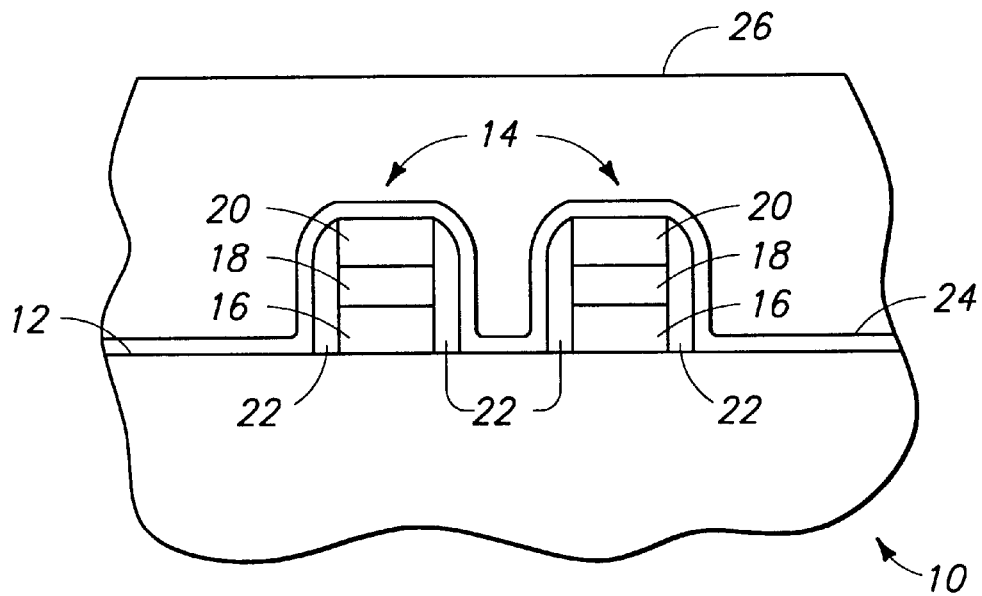
FIG. 1 is a diagrammatic sectional view of a semiconductor wafer fragment at one prior art processing step, and is discussed in the "Background" section above.
Figure 2:
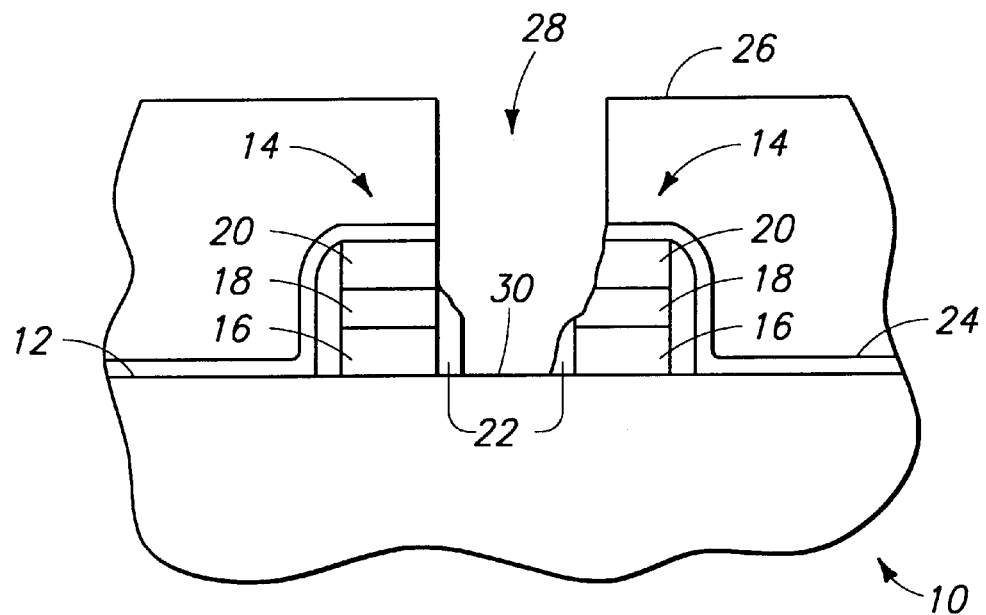
FIG. 2 is a view of the FIG. 1 wafer fragment at a prior art processing step subsequent to that shown by FIG. 1.
Figure 3:
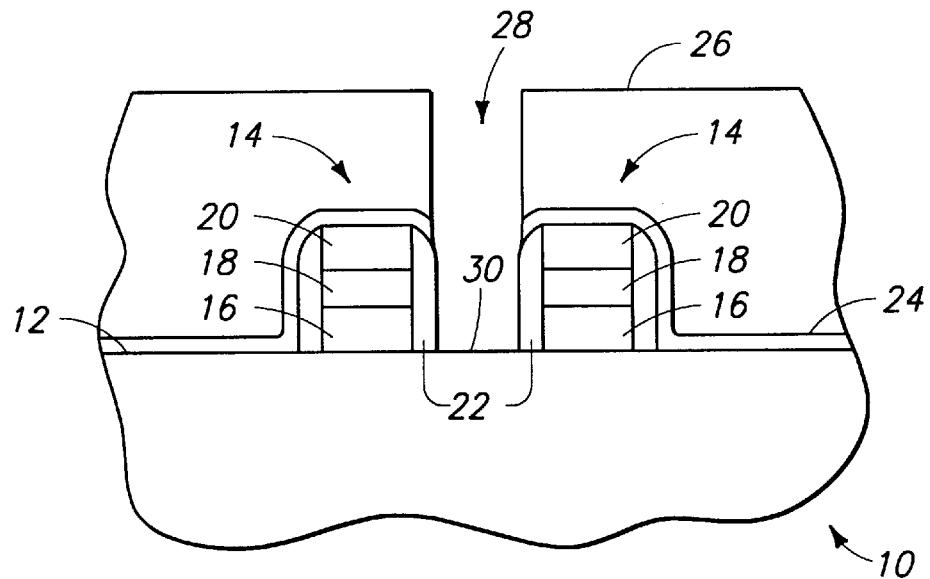
FIG. 3 is a view of the FIG. 1 wafer fragment at a prior art processing step subsequent to that shown by FIG. 1.
Figure 5:
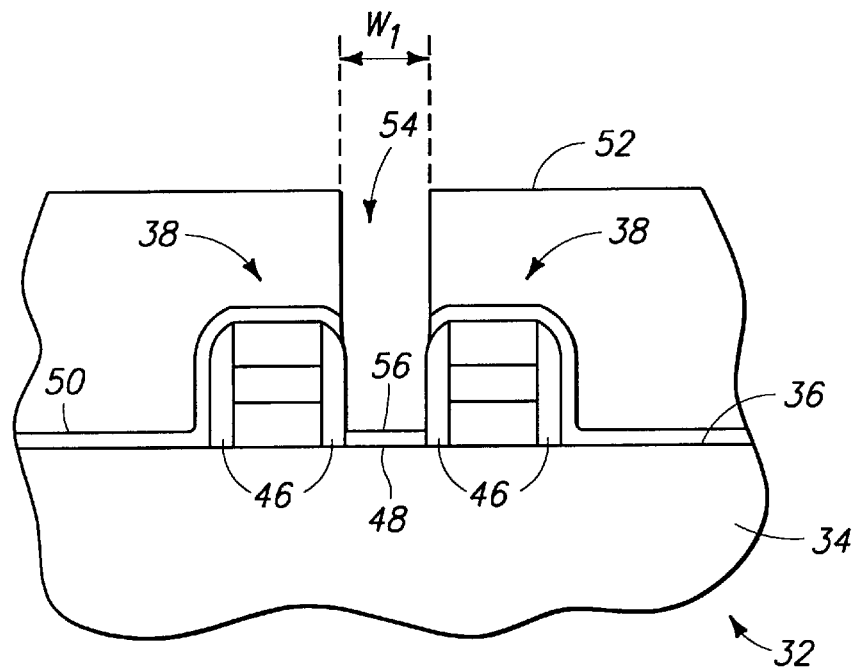
FIG. 5 is a view of the FIG. 4 wafer fragment at a processing step subsequent to that shown by FIG. 4.

Referring to FIG. 5, BPSG layer 52 is patterned and etched over contact area 48 to form a contact opening 54 between conductive lines 38. Preferably, such etch is an anisotropic dry etch which is conducted through layer 52 to a degree sufficient to leave at least a portion 56 of TEOS layer 50 over contact area 48 at the bottom of the contact opening. Exemplary conditions for such an etch in an Applied Materials 5000 reactor are 45 mTorr, 900 W, 40 Gauss, 20 sccm $CF_4$, 45 sccm $CHF_3$, 80 sccm Ar, 9000 mTorr He backside pressure. Such etch might also be conducted as a second part of a 2-step etch, where the first etches oxide at a faster rate. Exemplary conditions in such instance for the first etch in the same reactor are 120 mTorr, 900 W, 90 Gauss, 20 sccm $CF_4$, 50 sccm $CHF_3$, 110 sccm Ar, 28 sccm $N_2$, 9000 mTorr He backside pressure. For purposes of the ongoing discussion, that portion of layer 52 which is etched and that portion of layer 50 which is left behind constitutes material between conductive lines 38 which is etched to a degree sufficient to leave at least some of the material (i.e., portion 56) over the substrate between the conductive lines. Such etch defines a contact opening 54 having a first lateral width dimension $W_1$. One advantage of leaving portion 56 behind over contact area 48 is that inner-most sidewall spacers 46 are not undesirably etched or overetched which prevents the above-described shorting conditions (FIG. 2) which can render a device useless.

Figure 6:
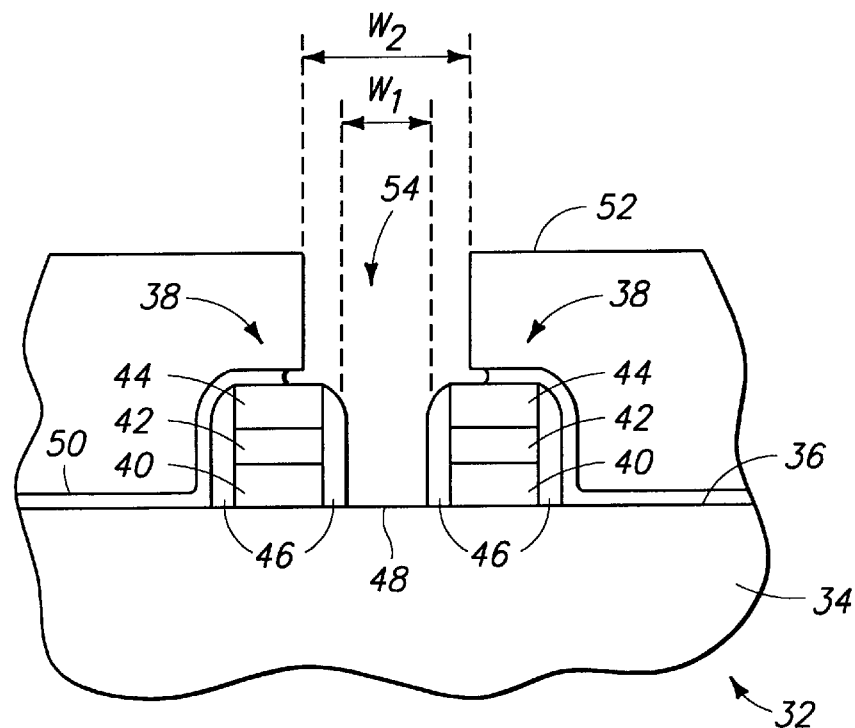
FIG. 6 is a view of the FIG. 4 wafer fragment at a processing step subsequent to that shown by FIG. 5.

Referring to FIG. 6, at least some of substrate 34 between conductive lines 38, and preferably all of the substrate defining contact area 48, is outwardly exposed by a wet etch of portion 56 (FIG. 5). Such etch can be conducted using a suitable aqueous solution comprising fluorine atoms, such as an aqueous 0.5% by weight HF solution, and $NH_4F$ solution or a mixture thereof. Such solutions have a greater etch rate for BPSG layer 52 than for first oxide layer 50. A typical etch rate ratio for such a solution as between BPSG layer 52 and first oxide layer 50 is about 3:1. Accordingly, etch timing is controlled to avoid overetching BPSG layer 52 and the nitride encapsulated conductive lines. Preferably, however, such etch is conducted using an aqueous solution which has a greater etch rate for portion 56 (and hence first oxide layer 50) than for BPSG layer 52. Such comprises a second etch which also preferably removes a desired amount of layers 50. 52 laterally outwardly of and beyond contact area 48 in a controlled manner to effectively increase the lateral width dimension of the upper portion of contact opening 54 to $W_2$ as shown. Such increase in lateral width dimension is desirable from the standpoint of subsequent contact formation which utilizes a conductive material, such as conductively doped polysilicon which is deposited into contact opening 54 and forms a contact plug.

In an alternative embodiment, the second etch comprises an isotropic wet etch using an aqueous solution comprising fluorine atoms and having less than or equal to about 10% by weight of a surfactant which changes the rate of etching as between the preferred BPSG and TEOS layers 52, 50 respectively. Such enables BPSG layer 52 to be etched at a slower rate than TEOS layer 50 which, accordingly, reduces if not eliminates any risk of overetch of the BPSG layer. Example surfactants include anionic surfactants (i.e., organic sulfonates such as sodium dodecyl sulfate, aliphatic sulfonates and phosphoric acid esters), cationic surfactants (i.e., quaternary ammonium salts such as dodecyl trimethyl ammonium salts), amphoteric surfactants (i.e., betaines such as dodecylbetaine), and nonionic surfactants (i.e., polyethylene oxide alcohols, octylphenols, and nonylphenols). One preferred surfactant comprises tetra methyl ammonium hydroxide (TMAH). Preferred solutions will etch TEOS layer 50 (remaining portion 56 in FIG. 5) at an etch rate which is faster than the rate at which BPSG layer 52 is etched which is described in more detail below. Such isotropic etch also etches layer 50 at a faster rate than side wall spacers 46 are etched. In this manner, contact opening 54 is controllably widened in lateral outwardly directions relative to conductive lines 38 to provide an increased critical dimension for accommodating formation of a polysilicon contact or plug to be formed therein.

As mentioned above, the second etch preferably etches layer 50 (portion 56) at a faster etch rate than BPSG layer 52. This is in contrast to a wet etch conducted with a solution to which the preferred etch rate changing surfactant has not been added. This is because the latter solution etches BPSG layer 52 at a faster rate than oxide layer 50. For example, a wet etch conducted with a 0.5% by weight $H_2O$:HF solution has been found to etch BPSG at a rate of around 830 Angstroms per minute and TEOS layer 50 (portion 56) at a rate of around 172 Angstroms per minute. The preferred wet etch, however, because of the presence of the etch rate changing surfactant, etches the BPSG layer 52 at a slower rate than the TEOS layer 50 so that the risk of undesirable overetch is reduced if not eliminated. Etch rates utilizing the preferred etching solution are around 20 Angstroms per minute for BPSG layer 52, and 40 Angstroms per minute for TEOS layer 50. An etch rate ratio as between TEOS, BPSG, and field oxide has been found to be about 4:2:1. Such is desirable from the standpoint of being able to laterally widen a contact opening in a controlled manner without the risk of overetching any of the nitride encapsulating materials or the substrate. Varying the molar concentrations of the etch rate changing surfactant can change the etch rate ratios to accommodate different etching regimes.

The above-described preferred processing method of controllably widening a contact opening by exposing the opening to an aqueous solution comprising fluorine, preferably having an added surfactant, after first anisotropically etching the contact opening is advantageous for a number of reasons. First, the initial anisotropic dry etch does not have to be conducted for as long a period of time in an attempt to clear all of the oxide from the bottom of the contact area 48. Such results in reducing or virtually eliminating the risk of over etching inner-most side wall spacers 46 and causing undesirable shorts as mentioned above. Any remaining oxide will be etched by the subsequently conducted wet etch which selectively etches the preferred TEOS and BPSG layers 50, 52 respectively, relative to nitride side wall spacers 46 and nitride caps 44 (FIG. 6). Additionally, the above-described method reduces the risk of damaging the substrate surface adjacent contact area 48 because such area will be cleared by the subsequently conducted wet etch. Such wet etch is much less destructive to the silicon surface than the previously conducted anisotropic dry etch.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents

What is claimed is:

1. A semiconductor processing method of forming a contact opening comprising:
   forming at least one conductive line over the substrate and adjacent a substrate contact area to which electrical connection is to be made;
   forming a first layer over the substrate to cover at least part of the contact area;
   forming a second layer over the first layer;
   anisotropically etching through the second layer and leaving at least a portion of the first layer over the contact area; and
   in the absence of any photoresist received over the second layer, isotropically etching substantially all of the first layer left behind and removing an amount of the second layer laterally outward beyond the contact area.

2. A semiconductor processing method of forming a contact opening comprising:
   forming at least one conductive line over the substrate and adjacent a substrate contact area to which electrical connection is to be made;
   forming a first layer over the substrate to cover at least part of the contact area;
   forming a second layer over the first layer;
   anisotropically etching through the second layer and leaving at least a portion of the first layer over the contact area;
   isotropically etching substantially all of the first layer left behind and removing an amount of the second layer laterally outward beyond the contact area; and
   wherein the isotropic etching comprises using an aqueous solution comprising fluorine, the solution etching the first layer at an etch rate which is faster than the rate at which the second layer is etched.

3. A semiconductor processing method of forming a contact opening comprising:
   forming at least one conductive line over the substrate and adjacent a substrate contact area to which electrical connection is to be made;
   forming a first layer over the substrate to cover at least part of the contact area;
   forming a second layer over the first layer;
   anisotropically etching through the second layer and leaving at least a portion of the first layer over the contact area;
   isotropically etching substantially all of the first layer left behind and removing an amount of the second layer laterally outward beyond the contact area; and
   wherein the isotropic etching comprises using an aqueous solution comprising fluorine and having less than or equal to about 10% by weight of an etch rate changing surfactant, the solution etching the first layer at an etch rate which is faster than the rate at which the second layer is etched.

4. A semiconductor processing method of forming a contact opening comprising:
   forming at least one conductive line over the substrate and adjacent a substrate contact area to which electrical connection is to be made;
   forming a first layer over the substrate to cover at least part of the contact area;
   forming a second layer over the first layer;
   anisotropically etching through the second layer and leaving at least a portion of the first layer over the contact area;
   isotropically etching substantially all of the first layer left behind and removing an amount of the second layer laterally outward beyond the contact area; and
   wherein the isotropic etching comprises using an aqueous solution of dilute HF having less than or equal to about 10% by weight of an etch rate changing surfactant comprising tetra methyl ammonium hydroxide (TMAH), the solution etching the first layer at an etch rate which is faster than the rate at which the second layer is etched.

5. A semiconductor processing method of forming a contact opening to a substrate comprising:
   forming a first oxide layer over the substrate, a portion of the first oxide layer overlying a contact area to which electrical connection is to be made;
   forming a second layer over the first layer which is different from the first layer;
   conducting an anisotropic dry etch of the second layer to a degree sufficient to leave at least some of the first oxide layer over the contact area; and
   conducting an isotropic wet etch to a degree sufficient to outwardly expose the contact area and to remove a desired amount of the second layer laterally outward beyond the contact area.

6. The semiconductor processing method of claim 5, wherein the wet etch etches the first layer at a faster rate than the second layer.

7. The semiconductor processing method of claim 5, wherein the contact opening is formed between a pair of sidewall spacers covering respective sidewalls of laterally spaced apart conductive lines.

8. The semiconductor processing method of claim 5, wherein the contact opening is formed between a pair of sidewall spacers covering respective sidewalls of laterally spaced apart conductive lines, and the wet etch etches the first layer at a faster rate than the both a) the sidewall spacers and b) the second layer.

9. The semiconductor processing method of claim 5, wherein the wet etch is conducted with an aqueous solution having less than or equal to about 10% by weight of an etch rate changing surfactant.

10. A semiconductor processing method of forming a contact opening comprising:

forming at least one conductive line over the substrate and adjacent a substrate contact area to which electrical connection is to be made;

forming a first layer over the substrate to cover at least part of the contact area;

forming a second layer over the first layer;

anisotropically etching through the second layer and leaving at least a portion of the first layer over the contact area; and isotropically etching, using an aqueous solution, substantially all of the first layer left behind and removing an amount of the second layer laterally outward beyond the contact area.

11. The semiconductor processing method of claim 10 wherein the aqueous solution comprises fluorine.

12. A semiconductor processing method of forming a contact opening comprising:

forming at least one conductive line over the substrate and adjacent a substrate contact area to which electrical connection is to be made;

forming a first layer over the substrate to cover at least part of the contact area;

forming a second layer over the first layer;

anisotropically etching through the second layer and leaving at least a portion of the first layer over the contact area; and isotropically etching substantially all of the first layer left behind and effective to outwardly expose the contact area and remove an amount of the second layer laterally outward beyond the contact area.

* * * * *

UNITED STATES PATENT AND TRADEMARK OFFICE
CERTIFICATE OF CORRECTION

PATENT NO. : 5,994,237
DATED : November 30, 1999
INVENTOR(S) : David S. Becker and Mark E. Jost It is certified that error appears in the above-identified patent and that said Letters Patent is hereby corrected as shown below:

At Column 2, line 49, after the word "rate", delete the word "is".

At Column 3, line 42, delete "defme" and insert the word --define--.

At Column 4, line 23, following the numeral "50", delete the "." and insert --,--.

Signed and Sealed this

Fifth Day of September, 2000

Attest:

Q. TODD DICKINSON

*Attesting Officer*          *Director of Patents and Trademarks*